(12) United States Patent
Zhu et al.

(10) Patent No.: US 12,360,046 B2
(45) Date of Patent: Jul. 15, 2025

(54) METHOD FOR PREPARING AgNPs@SASP SUBSTRATE MATERIAL AND APPLICATION THEREOF

(71) Applicant: Henan Agricultural University, Zhengzhou (CN)

(72) Inventors: Yaodi Zhu, Zhengzhou (CN); Miaoyun Li, Zhengzhou (CN); Lijun Zhao, Zhengzhou (CN); Zhiyuan Sun, Zhengzhou (CN); Huimin Niu, Zhengzhou (CN); Jianhan Lin, Zhengzhou (CN); Gaiming Zhao, Zhengzhou (CN); Lingxia Sun, Zhengzhou (CN); Yanxia Liu, Zhengzhou (CN); Shijie Liu, Zhengzhou (CN); Jiaqi Tian, Zhengzhou (CN)

(73) Assignee: Henan Agricultural University, Zhengzhou (CN)

( * ) Notice: Subject to any disclaimer, the term of this patent is extended or adjusted under 35 U.S.C. 154(b) by 650 days.

(21) Appl. No.: 17/686,465

(22) Filed: Mar. 4, 2022

(65) Prior Publication Data

US 2023/0168202 A1    Jun. 1, 2023

(30) Foreign Application Priority Data

Nov. 26, 2021   (CN) .......................... 202111421189.8

(51) Int. Cl.
*G01N 21/65*   (2006.01)
*C30B 19/12*   (2006.01)

(52) U.S. Cl.
CPC ........... *G01N 21/658* (2013.01); *C30B 19/12* (2013.01)

(58) Field of Classification Search
CPC ...... G01N 21/658; C30B 19/12; Y02A 50/30; B22F 9/24
See application file for complete search history.

(56) References Cited

FOREIGN PATENT DOCUMENTS

CN         107243626 A   *  10/2017  ............ B22F 1/0018

OTHER PUBLICATIONS

Quasi-spherical silver nanoparticles: Aqueous Synthesis and size control by the seed-mediated Lee-Meisel method (Year: 2013).*
Identification and quantitation of pathogenic bacteria via in-situ formation of silver nanoparticles on cell walls, and their detection via SERS (Year: 2016).*

* cited by examiner

Primary Examiner — Anthony J Zimmer
Assistant Examiner — Jaanzeb C Raja
(74) Attorney, Agent, or Firm — Bay State IP, LLC

(57) ABSTRACT

Disclosed are a method for preparing a AgNPs@SASP substrate material and application thereof. The present disclosure uses cyclohexane as an organic phase and ethanol as an inducer, and uses the interfacial tension of an organic/water interface for self-assembly to arrange the nanoparticles in a single layer. The addition of a low-dielectric solvent as an inducer reduces the charge density on the nanoparticles. As a result, the van der Waals force combined with the reduction of the Coulomb repulsion force cause the nanoparticles to reassemble at the organic/water interface to form a new equilibrium, and a SERS platform of AgNPs in a two-dimensional array is prepared. SERS detection and peak attribution analysis of different food-borne pathogen spores are carried out, and qualitative analysis is carried out by a multivariate statistical method to realize the rapid identification of spore-forming bacteria.

5 Claims, 9 Drawing Sheets

METHOD FOR PREPARING AgNPs@SASP SUBSTRATE MATERIAL AND APPLICATION THEREOF

CROSS REFERENCE TO RELATED APPLICATION

This patent application claims the benefit and priority of Chinese Patent Application No. 202111421189.8, filed on Nov. 26, 2021, the disclosure of which is incorporated by reference herein in its entirety as part of the present application.

TECHNICAL FIELD

The present disclosure belongs to the technical field of nanomaterials, and specifically relates to a method for preparing a AgNPs@SASP substrate material and application thereof.

BACKGROUND ART

Food-borne pathogens are pathogenic bacteria that can cause food poisoning or food-borne transmission. They cause gastrointestinal inflammation in humans, such as food poisoning, nausea and diarrhea. Food-borne diseases caused by food-borne pathogens cause about 20 million deaths worldwide each year. Food-borne pathogens are one of the important causes of food safety problems. Among them, food-borne spore-forming bacteria, such as *C. perfringens*, *B. subtilis* and *B. cereus*, can produce dormant spores under environmental stress, which are extremely resistant to radiation, heat, dryness, extreme pH, hydrostatic pressure and some toxic chemicals. Once the conditions are suitable, the spores can germinate and produce toxins, which will not only lead to food spoilage and deterioration, not conducive to long-term food preservation, but also cause health hazards to consumers. Therefore, spore-forming bacteria is a great threat to food safety. If the spores in the food can be identified in advance, and corresponding measures can be taken to kill the spores or control their germination, etc., not only can the shelf life of the product be prolonged, but also food-borne safety hazards can be reduced. However, because the spores of bacteria are relatively small and have little difference in appearance, it is difficult to identify them in time using traditional methods. Therefore, the development of rapid, sensitive, highly reproducible, and timely and effective detection technology is the key to the prevention and control of spores, and it is also an urgent problem to be solved for world public health security.

At present, the main detection method for spores is the plate culture method, which combines various induction methods of vegetative germination factors or non-nutritive germination factors to promote spores to germinate into vegetative cells, and then indirectly identify the contamination of spores in the tested samples through colony count and 16S identification. Although the results are more accurate, the culture, isolation, and identification process is time-consuming and labor-intensive, and the detection time is poor. In recent years, with the development of spectroscopy detection technology, convenient and fast spectroscopy detection technology has been increasingly applied to food microbiological detection. For example, fluorescence spectroscopy technology, which detects the fluorescent substance and content in the sample by detecting the fluorescence spectrum or intensity emitted by the sample, has the advantages of simplicity, quickness, good reproducibility, and high selectivity, but it lacks the specificity of chemical structure information, and is easily affected by mutual interference and overlapping peaks, which is difficult to analyze; Near-infrared spectroscopy technology mainly uses hydrogen-containing groups to effectively obtain the physical information, chemical information or biological information contained in the sample spectrum, which is fast and non-destructive, easy to operate and low cost, but it is not suitable for the detection of samples with high moisture content and has a low sensitivity. These methods have unavoidable limitations in the detection of food-borne pathogen spores.

Raman spectroscopy detection technology can analyze the different biochemical components contained in different types of cells through different Raman spectra characteristic peaks. Aiming at the shortcoming of weak Raman signal of microbial cells, combined with the rough surface of precious metals or nanoparticles as substrates (such as gold, silver), surface-enhanced Raman spectroscopy (SERS) technology is developed, Raman signal is significantly enhanced by electromagnetic enhancement caused by plasma resonance phenomenon of gold and silver nanoparticles (hotspot), thereby obtaining more structure signals of microorganisms. SERS, as a biological "fingerprint" pattern recognition technology, can provide abundant structure information of biomolecules. It has the advantages of no labeling, simple operation, short detection time and non-destructiveness, and can meet the needs of rapid detection in the field of food quality and safety.

With the increasing application of SERS technology in rapid microbial detection, the development and application of SERS substrate materials have become the focus of research. SERS substrates are currently mainly divided into two categories, one is the liquid-phase substrate material of metal nano-sols, and the other is the solid-phase substrate material that includes rough metal surface, self-assembled liquid film of metal nanoparticles, and metal nanoparticles fixed on the surface by photolithography technology. The preparation of metal sols of the liquid-phase substrate material is simple, and easy to operate with a low cost. However, nanoparticles vary in size and shape and are prone to uncontrollable aggregation with a low stability. In addition, the combination of nano "hotspot" and the sample to be tested is difficult to control during SERS detection, resulting in poor reproducibility. It is necessary to continuously optimize the size and shape of nanoparticles to improve the sensitivity and reproducibility of SERS detection. The material with a rough metal surface in the solid-phase substrate has better stability in use and storage, but the roughened surface often has uniformity problems, which directly affects the stability and reproducibility of the SERS detection results. The highly ordered substrate by photolithography technology can be very uniform, but the preparation cost is expensive. The advantages of self-assembly technology have gradually emerged in application research. A large number of high-density "hotspots" are uniformly gathered between the interfaces, which can be completed spontaneously within ten seconds and can be directly subjected to Raman detection after transfer. How to synthesize AgNPs with a controllable size and a uniform shape has always been the interest of researchers. Therefore, the performance of the SERS substrate material mainly depends on whether there is a stable and uniformly arranged substrate. The development of a SERS substrate material with a controllable size and a stable arrangement is very important for SERS detection.

In view of this, the present disclosure is proposed.

SUMMARY

In view of the problems in the prior art, the present disclosure provides a method for preparing a AgNPs@SASP substrate material and application thereof. AgNPs prepared by a seed mediated two-step growth method are used to obtain a dense and uniform AgNPs film by liquid-liquid self-assembly technology. SERS detection and peak attribution analysis of different food-borne pathogen spores are carried out, and qualitative analysis is carried out by a multivariate statistical method to realize the rapid identification of spore-forming bacteria.

To solve the above technical problems, the present disclosure adopts the following technical schemes:

A method for preparing a AgNPs@SASP substrate material, the method comprising:
(1) preparation of AgNPs by a seed mediated two-step growth method;
(2) preparation of a solid-phase AgNPs@SASP substrate material by self-assembly of AgNPs prepared by a seed mediated two-step growth method, wherein preparing a self-assembled silver nanoparticle metallic film by a one-step method at a water-cyclohexane liquid-liquid interface, which is the AgNPs@SASP substrate material.

Further, step (1) preparation of AgNPs by a seed mediated two-step growth method comprises:
a. adding ultrapure water to an aqueous trisodium citrate solution, heating, then adding a $AgNO_3$ solution and a $NaBH_4$ solution, stirring, thereafter cooling to room temperature, and adding ultrapure water to obtain a AgNPs starting seed solution;
b. adding the aqueous trisodium citrate solution to ultrapure water, then adding the $AgNO_3$ solution and the AgNPs starting seed solution at a constant speed, stirring a resulting mixed solution vigorously for 1 h, cooling to room temperature, then continuing the addition of the aqueous trisodium citrate solution and the $AgNO_3$ solution, heating and stirring vigorously for 1 h, adding ultrapure water, then cooling to room temperature, and storing at 4° C. away from light.

Further, step (2) preparation of a solid-phase AgNPs@SASP substrate material by self-assembly of AgNPs prepared by a seed mediated two-step growth method comprises: enriching the AgNPs prepared by a seed mediated two-step growth method in step (1) by centrifugation, then suspending in absolute ethanol by ultrasonic dispersion, injecting to a water-cyclohexane oil-water interface with a pipette, where AgNPs are drawn to the liquid-liquid interface by surface tension to form a thin film with a monomolecular arrangement floating on a liquid surface after volatilization of cyclohexane, inserting a glass slide or a silicon wafer deep below the liquid surface, making the AgNPs film adhered to the silicon wafer by an inclined inserting and pulling method, and drying with nitrogen.

Further, in step a, a mass fraction of the aqueous trisodium citrate solution is 1%, a mass fraction of the $AgNO_3$ solution is 1%, a mass fraction of the $NaBH_4$ solution is 0.1%, and a volume ratio of the aqueous trisodium citrate solution, the ultrapure water, the $AgNO_3$ solution and the $NaBH_4$ solution is 20:75:1.7:2.

Further, a heating temperature in step a is 70° C., a heating time is 15 min, and the stirring is conducted by stirring at 70° C. and then cooling to room temperature.

Further, in step b, a volume ratio of the ultrapure water, the AgNPs starting seed solution, the $AgNO_3$ solution added for the first time, and the aqueous trisodium citrate solution added for the first time is 75:10:1.7:2, wherein a mass fraction of the $AgNO_3$ solution is 1%, and a mass fraction of the aqueous trisodium citrate solution is 1%.

Further, in step b, an amount of the $AgNO_3$ solution and an amount of the aqueous trisodium citrate solution added for the second time are the same as those of the first time, and a heating temperature is 70° C.

An application of the AgNPs@SASP substrate material prepared by the method of the present disclosure as a SERS substrate is disclosed.

Further, SERS detection is performed on spores of different food-borne pathogens to realize rapid identification of spore-forming bacteria.

Further, the spores of food-borne pathogens include at least one of *C. perfringens* spores, *B. subtilis* spores, and *B. cereus* spores.

The beneficial effects of the present disclosure are as follows: the present disclosure uses cyclohexane as an organic phase and ethanol as an inducer, and uses the interfacial tension of the organic/water interface for self-assembly to arrange the nanoparticles in a single layer. The addition of a low-dielectric solvent as an inducer reduces the charge density on the nanoparticles. As a result, the van der Waals force combined with the reduction of the Coulomb repulsion force cause the nanoparticles to reassemble at the organic/water interface, and a SERS platform of AgNPs in a two-dimensional array is prepared.

The present disclosure optimizes the size and shape of nanoparticles through a seed mediated two-step growth method, and combines a liquid/liquid interface self-assembly technology to develop a SERS-based AgNPs self-assembled solid-phase (denoted as AgNPs@SASP) substrate material. An average particle size is about 90.62 nm calculated by a laser particle size analyzer. Scanning electron microscopy results showed that the AgNPs in a two-dimensional array self-assembled at the liquid/liquid interface were uniformly distributed with a spherical shape, which had good SERS reproducibility and enhancement effect up to $1.79 \times 10^4$.

The SERS technology based on AgNPs self-assembled solid phase substrate material is used to detect spores of the three different food-borne pathogens and analyze the peak attribution. It can be observed that the number and intensity of Raman vibration peaks of $Ca^{2+}$-DPA are dominant in the SERS spectra of the three spores, and differences in the intensity of Raman vibration peaks of $Ca^{2+}$-DPA are observed in SERS spectra of different spores. In addition, different spores can show unique Raman vibration peaks in different wavebands, and different Raman vibration peaks are attributed to different compositions and vibrational forms of chemical bonds. The HCA analysis result not only effectively realized the distinction between the three spores, but also realized the distinction between *Clostridium* spores and *Bacillus* spores. LDA completely distinguished the SERS spectra of spores of the three food-borne pathogens with good sensitivity and specificity, all of which were 100%. Therefore, it can realize the rapid and accurate identification of spores of different food-borne pathogens.

In the present disclosure, the SERS technology using AgNPs@SASP as a substrate material can quickly identify food-borne microorganisms and their spores, and provides an effective means for ensuring food safety.

DETAILED DESCRIPTION OF THE EMBODIMENTS

Figure 1:
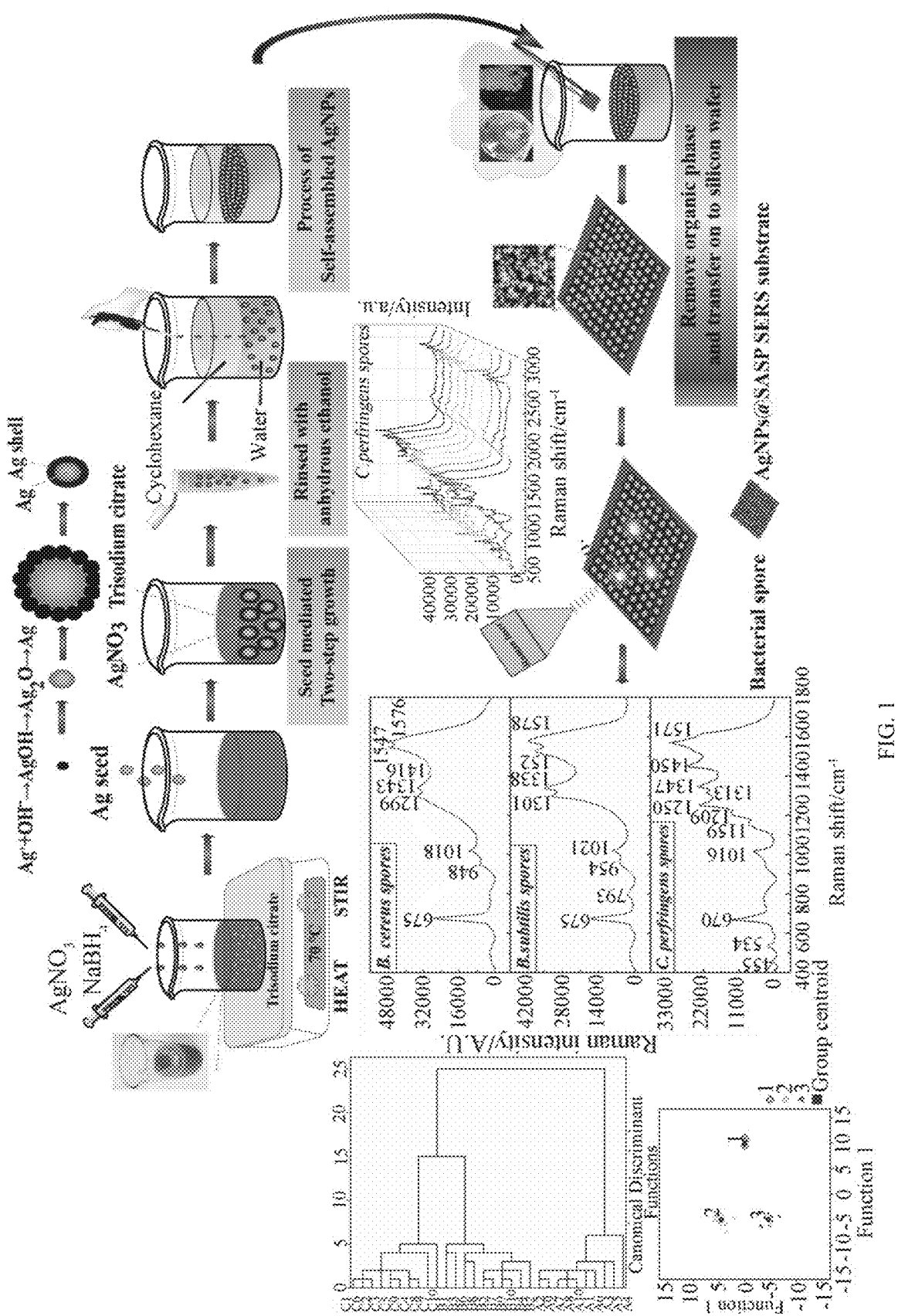
FIG. 1 is a schematic diagram of the preparation of AgNPs@SASP substrate material and the process of the SERS detection.

The present disclosure will be further described below in conjunction with specific embodiments. It should be understood that the following embodiments are only used to illustrate the present disclosure and not to limit the scope of the present disclosure, and those skilled in the art can make some non-essential improvements and adjustments based on the content of the above disclosure.

Example 1

A method for preparing the AgNPs@SASP substrate material in this example comprises:
(1) Preparation of AgNPs by a Seed Mediated Two-Step Growth Method;
a. 75 ml of ultrapure water was added to 20 ml of trisodium citrate with a mass fraction of 1% and heated in a round bottom flask at 70° C. for 15 min, 1.7 ml of $AgNO_3$ solution with a mass fraction of 1% was added to the resulting mixture, then 2 ml of $NaBH_4$ solution with a mass fraction of 0.1% was quickly added thereto, the reaction solution was stirred at 70° C., then cooled to room temperature, and then water was added to a volume of 100 ml to obtain a AgNPs starting seed solution.
b. 75 ml of water and 2 ml of aqueous trisodium citrate solution with a mass fraction of 1% were added in a 100 ml round bottom flask, then 10 ml of the prepared AgNPs starting seed solution and 1.7 mL of $AgNO_3$ solution with a mass fraction of 1% were added thereto at a constant speed, the mixed solution was vigorously stirred for 1 h, this step was repeated twice (i.e., after cooling to room temperature, 2 ml of 1% aqueous trisodium citrate solution and 1.7 ml of 1% $AgNO_3$ solution were added, heated at 70° C. and stirred vigorously for 1 h), ultrapure water was added to 100 ml, the resulting solution was cooled to room temperature, and stored at 4° C. away from light.
(2) Preparation of a Solid-Phase Substrate Material by Self-Assembly of AgNPs Prepared by a Seed Mediated Two-Step Growth Method.

The present disclosure proposes a one-step method for preparing self-assembled silver nanoparticle metallic film at the water-cyclohexane liquid-liquid interface under the action of cetyltrimethylammonium bromide (CTAB) surfactant. Ethanol is used to adjust the charge density on the surface of silver nanoparticles to create an equilibrium state on the surface of water and cyclohexane. And a flexible silver nanoparticle metallic film can be obtained after a simple evaporation process of the cyclohexane phase.

A glass container and a silicon wafer were soaked and cleaned with aqua regia (a volume ratio of concentrated hydrochloric acid to concentrated nitric acid of 3:1) to remove impurities on the surface, washed with deionized water several times, and dried with nitrogen for use. 2.5 ml of deionized water as a water phase was added into a 10 ml small beaker, 1 ml of cyclohexane as an oil phase was added along the wall of the beaker, mixed, and followed by standing for several seconds to form a clearly visible layered oil-water interface. 10 ml of the AgNPs treated with a seed mediated two-step growth method prepared in the previous step was taken, enriched by centrifugation, and then suspended in absolute ethanol by ultrasonic dispersion. The resulting suspension was injected to a water-cyclohexane oil-water interface with a pipette. It can be observed with naked eyes that the AgNPs dispersed in ethanol will be drawn to the liquid-liquid interface by surface tension and self-assembled together in constant motion. The entire self-assembly process was very rapid, and it can be observed that the AgNPs formed a thin film with a monomolecular arrangement floating on a liquid surface after volatilization of cyclohexane. The cleaned glass slide or silicon wafer was deep below the liquid surface by tweezers, a good and complete silver film was found and attached to the silicon wafer by an inclined inserting and pulling method, and dried under nitrogen to obtain the AgNPs@SASP substrate material, which was the SERS substrate.

Figure 2:
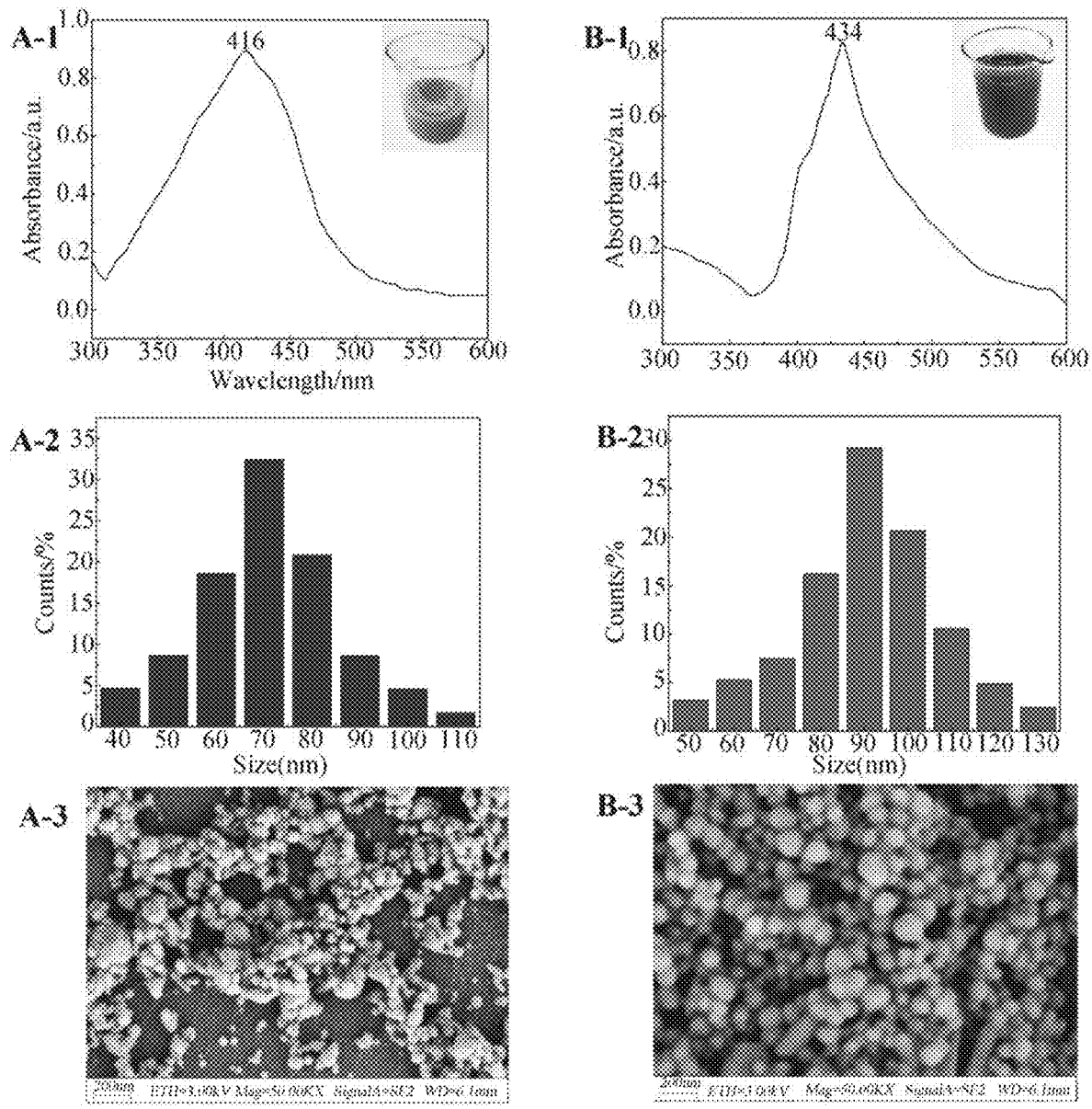
FIG. 2 shows the characterization results of AgNPs prepared by a seed mediated two-step growth method. Panel (A-1) shows a UV-Vis spectrum of the AgNPs seed solution prepared in step (1) a of Example 1, panel (A-2) shows the particle size distribution of the AgNPs seed solution prepared in step (1) a of Example 1, panel (A-3) shows the SEM image of the AgNPs seed solution prepared in step (1) a of Example 1; panel (B-1) shows a UV-Vis spectrum of the AgNPs seed solution in step (1) a treated with a seed mediated two-step growth method, panel (B-2) shows the particle size distribution of AgNPs seed solution in step (1) a treated with a seed mediated two-step growth method, panel (B-3) shows the SEM image of the AgNPs seed solution in step (1) a treated with a seed mediated two-step growth method.

1. Characterization of SERS Substrate
1). Preparation of AgNPs by a Seed Mediated Two-Step Growth Method The AgNPs was prepared by a seed mediated two-step growth method. The AgNPs seed solution prepared in the first stage was gray-green, and the AgNPs treated with a seed mediated two-step growth method was yellow-brown. The strongest absorption peak in the UV-Vis spectrum of the AgNPs seed solution prepared in the first stage is located at 416 nm (panel A-1 in FIG. 2); the strong absorption peak in the UV-Vis spectrum of the AgNPs treated with a seed mediated two-step growth method is located at 435 nm (panel B-1 in FIG. 2), and the ultraviolet absorption peak is red-shifted and more rounded and sharp, indicating that the particle size uniformity and shape of AgNPs have been optimized. Combined with a laser particle size analyzer, the particle size analysis of the AgNPs sol was analyzed, the average particle size of the AgNPs seed solution prepared in the first stage is about 70.86 nm, the average particle size of the AgNPs treated with a seed mediated two-step growth method is about 90.62 nm, and the particle size range of AgNPs treated with a seed mediated two-step growth method is more concentrated between 80-100 nm. From the results of SEM image (panel C-1 in FIG. 2 and panel C-2 in FIG. 2), it can be visually observed that the particle size uniformity and shape integrity of AgNPs treated with a seed mediated two-step growth method have been well improved. The results show that the AgNPs prepared by a seed mediated two-step growth method can prepare nanomaterials with good particle size uniformity, which effectively avoids the problem of the unstable SERS detection signals caused by the inability of AgNPs to maintain relatively uniform shape and size during synthesis.

2. Characterization of AgNPs@SASP Substrate Materials

Figure 3:
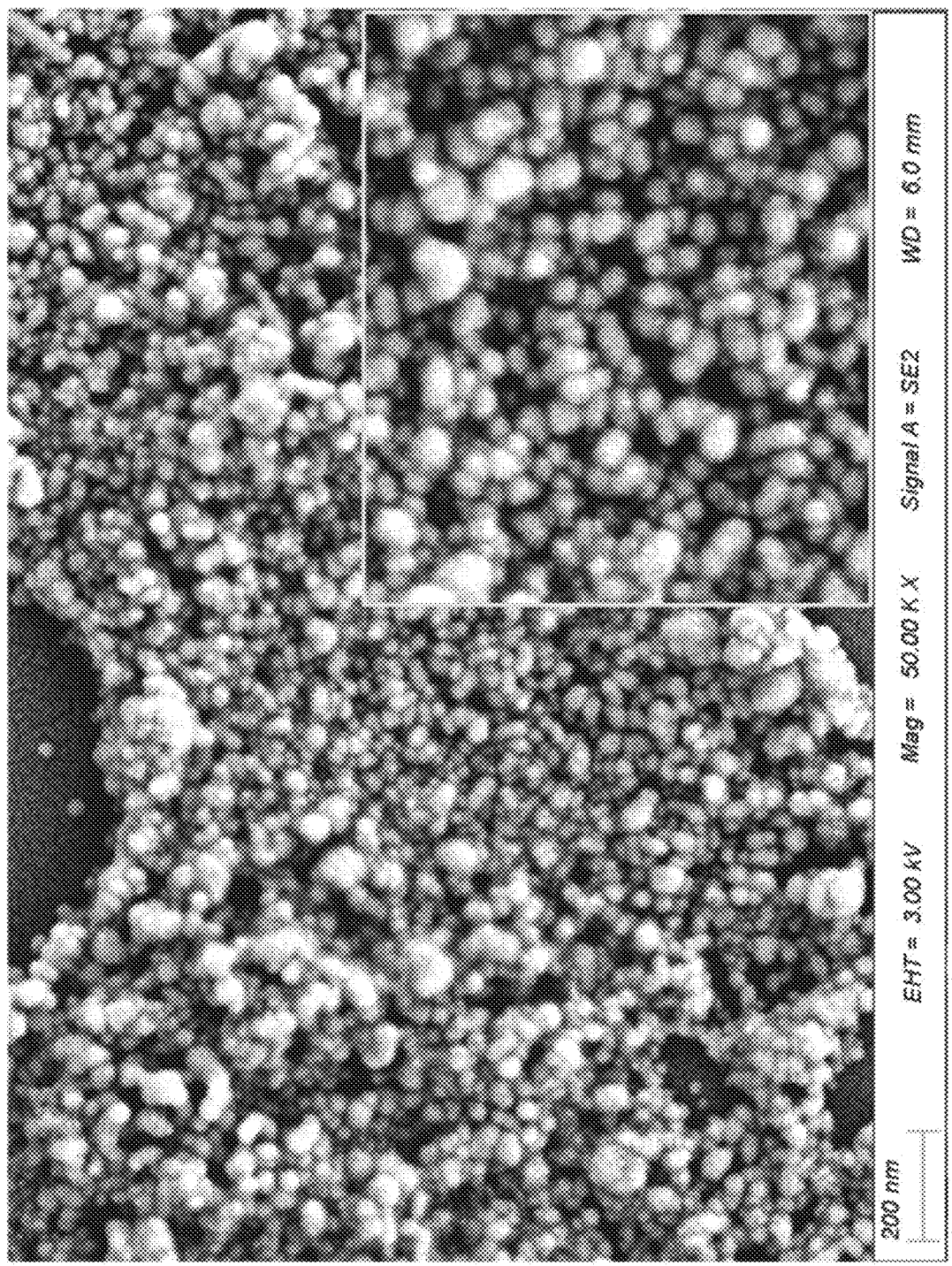
FIG. 3 is the SEM image of the AgNPs@SASP substrate material prepared in Example 1.

A solid-phase substrate material was prepared by self-assembly of AgNPs prepared by a seed mediated two-step growth method (denoted as AgNPs@SASP). The present disclosure uses cyclohexane as an organic phase and ethanol as an inducer, and uses the interfacial tension of the organic/water interface for self-assembly to arrange the nanoparticles in a single layer. The addition of a low-dielectric solvent as an inducer reduces the charge density on the nanoparticles. As a result, the van der Waals force combined with the reduction of the Coulomb repulsion force cause the nanoparticles to reassemble at the organic/water interface to form a new equilibrium, and a SERS platform of AgNPs with a two-dimensional array is prepared. The SEM image of AgNPs@SASP is shown in FIG. 3. The results show that the AgNPs successfully self-assembled tightly into a layer of AgNPs dot array with a large area, and the self-assembled AgNPs with a two-dimensional array are evenly distributed on the silicon wafer. As a new SERS platform, the AgNPs@SASP with a two-dimensional AgNPs hotspot array has higher sensitivity and reproducibility, and is more suitable for practical detection applications.

2. Enhancement Effect and Reproducibility of AgNPs@SASP Substrate Material

Figure 4:
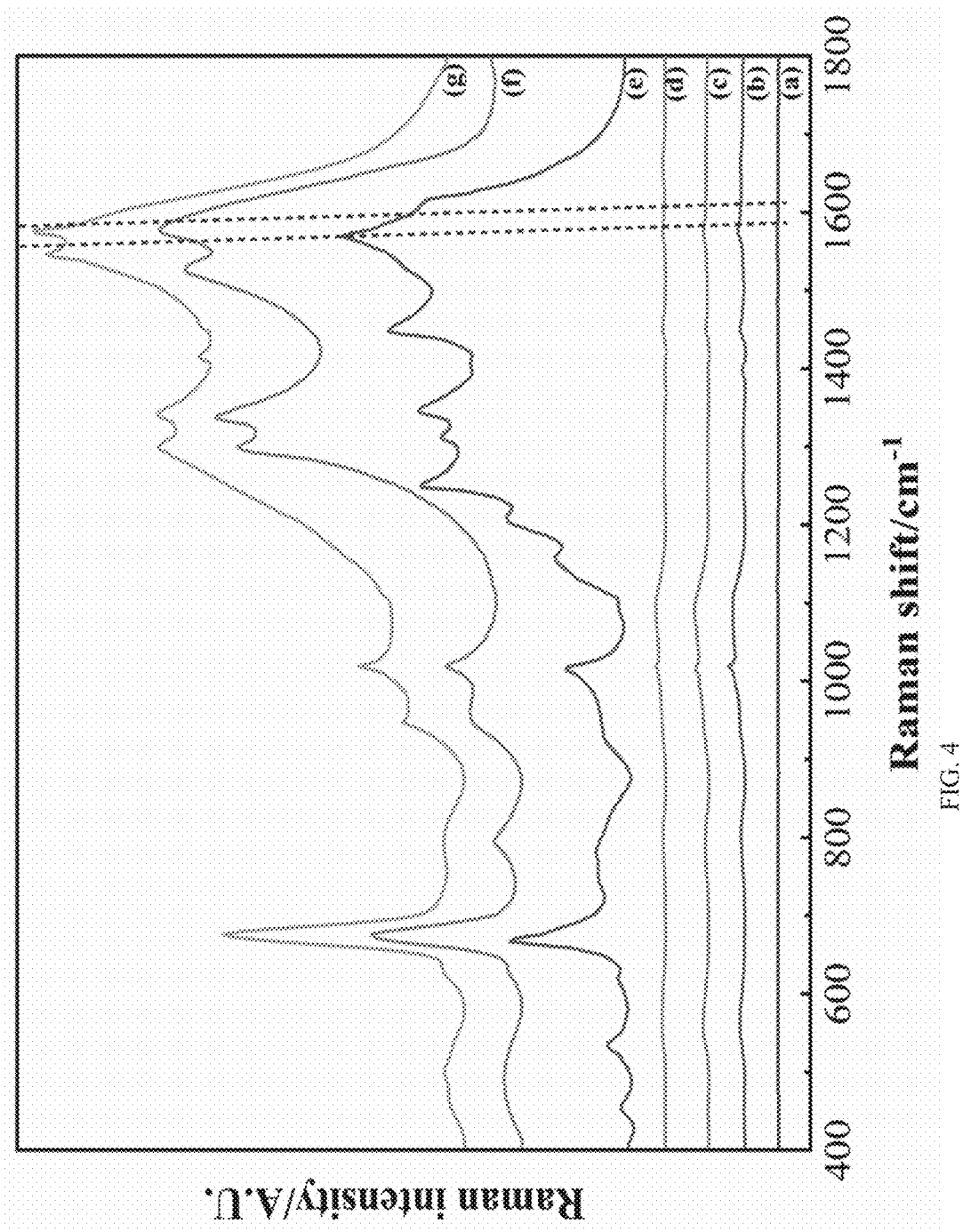
FIG. 4 shows the comparison results of the enhancement effect of the AgNPs@SASP substrate material prepared in Example 1.
Figure 5:
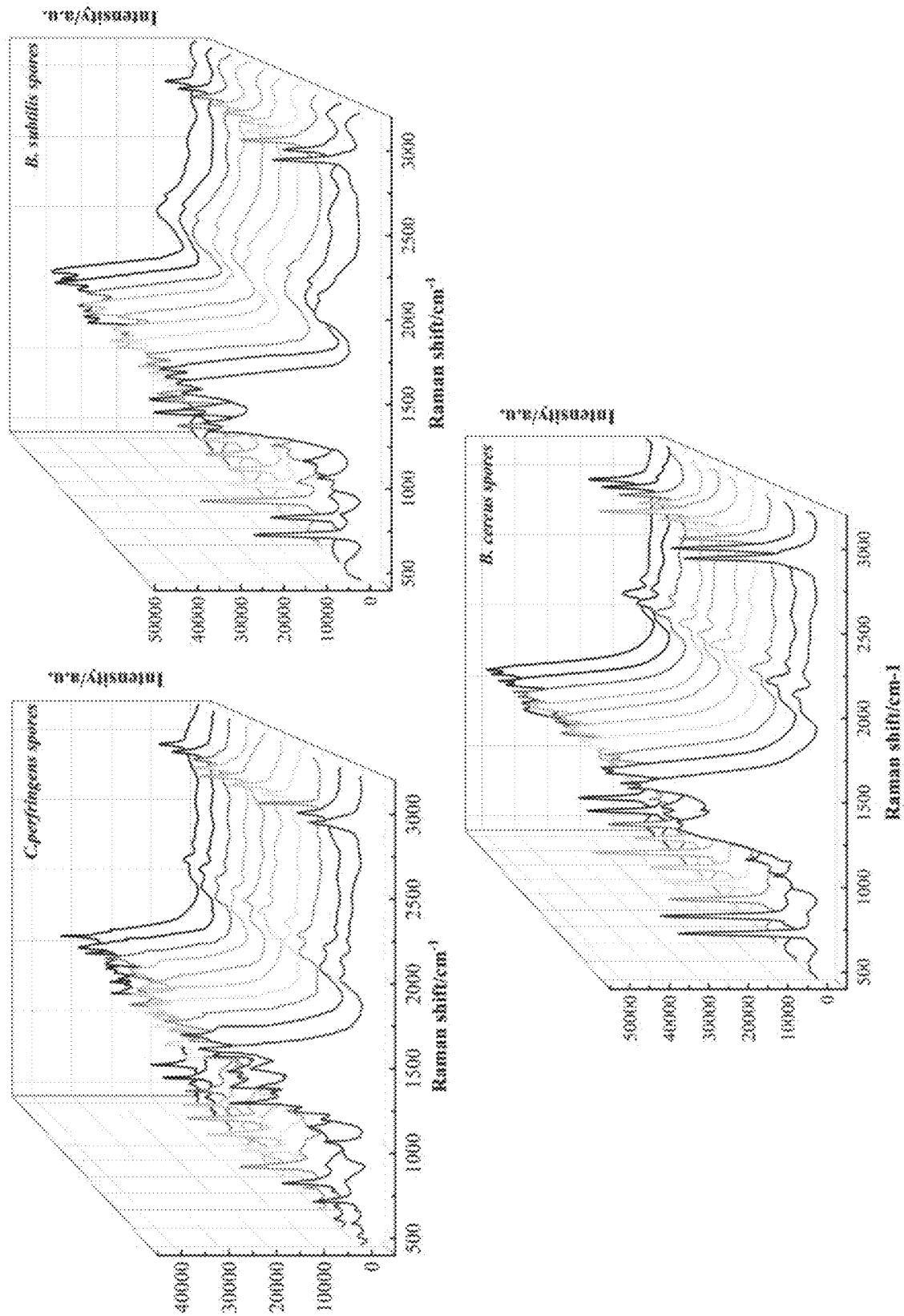
FIG. 5 shows the reproducibility results of SERS detection for the three spores based on AgNPs@SASP substrate material.
Figure 6:
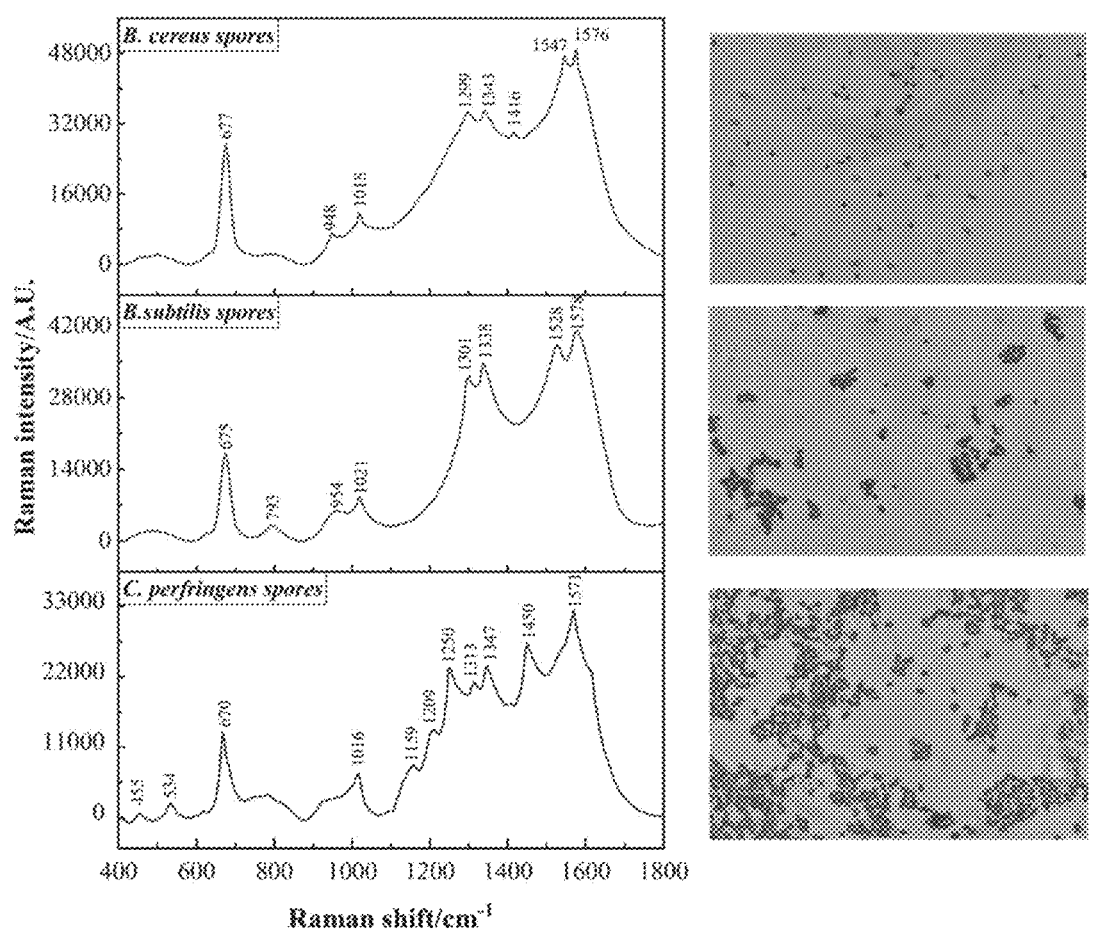
FIG. 6 shows an average SERS spectra of the spores of three different food-borne pathogens.

In order to understand the enhancement effect of AgNPs@SASP as the SERS substrate material, a laser Raman spectrometer was used to collect the SERS spectra of single samples of the three spores and the three spores on AgNPs@SASP respectively. The comparison results of the enhancement effect of AgNPs@SASP substrate materials are shown in FIG. 4 and Table 1. It can be seen from FIG. 4 that the Raman spectra of single samples of the three spores have a low peak intensity and few characteristic peaks, which makes it difficult to qualitatively identify different spores; Using AgNPs@SASP substrate material for signal enhancement, the Raman signals of the three spores are significantly enhanced, and the characteristic peaks with weaker signals can also be displayed in the SERS spectrum. The number increase of the Raman characteristic peaks is more conducive to distinguishing and identifying different spores. Therefore, AgNPs@SASP as a substrate material has a good signal enhancement effect on Raman spectra.

In order to quantify the SERS enhancement effect of AgNPs@SASP on the three spores, taking the common strongest peak band of 1570-1577 cm$^{-1}$ (CaDPA) of the three spores as an example, an enhancement factor of AgNPs@SASP as the substrate material was calculated, the calculation formula is shown in formula (1), where $C_{SERS}$ and $I_{SERS}$ are the concentration and the intensity value of the single peak of the test sample when the substrate material is used, respectively; $C_{RS}$ and $I_{RS}$ are the concentration and the intensity value of the single peak of the test sample when the substrate material is not used, respectively. In order to better obtain the Raman spectrum of the simple sample, and better highlight the enhancement effect of the substrate material, the concentration of the simple sample is 100 times that of the enhanced detection in the detection of the present disclosure, i.e., $C_{RS}$=100 $C_{SERS}$. The calculation results of the SERS enhancement factor of AgNPs@SASPS on the three spores are shown in Table 1. The results show that AgNPs@SASP has a good SERS enhancement effect on all the three spores, with an enhancement factor up to $1.79\times10^4$, which has a good SERS enhancement effect.

$$AEF = \frac{I_{SERE}/C_{SERS}}{I_{RS}/C_{RS}} \quad (1)$$

TABLE 1

Calculation results of the SERS enhancement factor of AgNPs@SASPS on three spores

| Target | SERS substrate | $I_{RS}$ (a.u.) | $I_{SERS}$ (a.u.) | AEF value |
| --- | --- | --- | --- | --- |
| C. perfringens spores | AgNPs@SASP | 340.23 | 9536.61 | $9.54 \times 10^3$ |
| B. subtilis spores | | 337.84 | 12150.82 | $1.22 \times 10^4$ |
| B. cereus spores | | 272.81 | 17882.87 | $1.79 \times 10^4$ |

Figure 7:
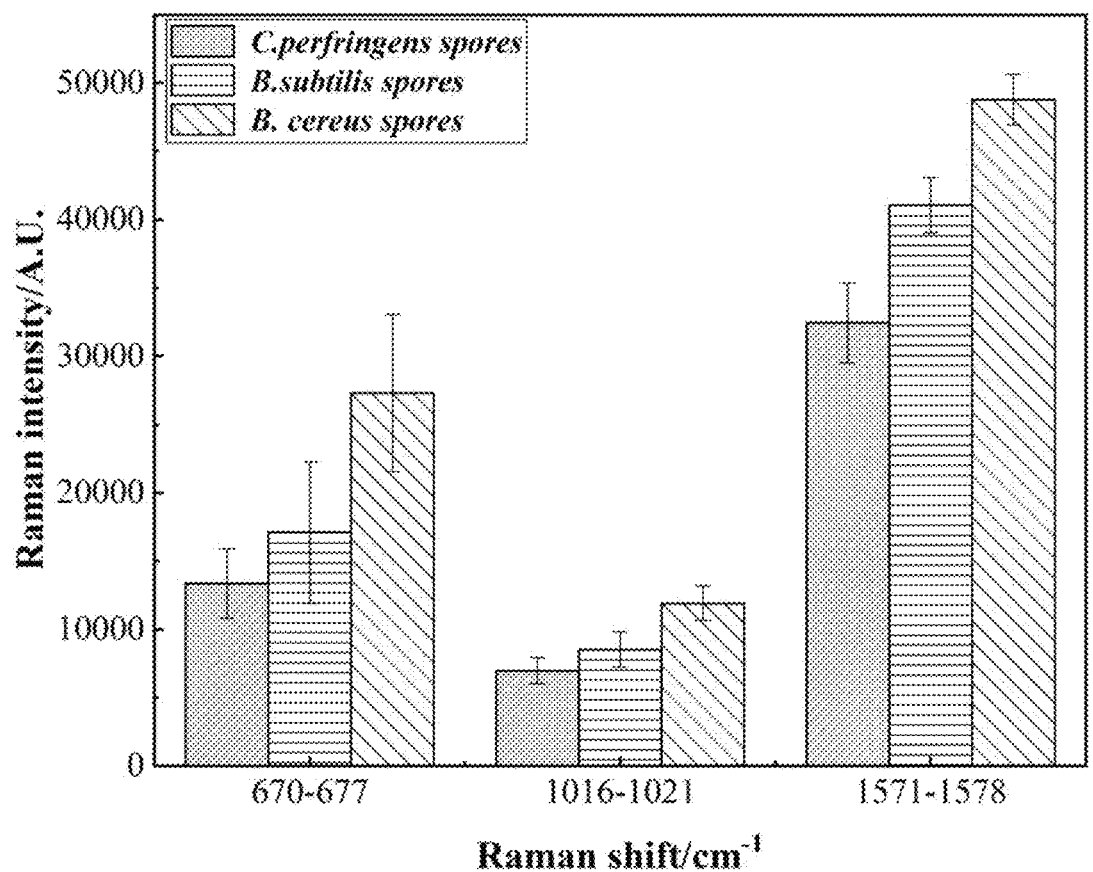
FIG. 7 shows the comparison results of the SERS peak intensity of $Ca^{2+}$-DPA of three different spores.
Figure 8:
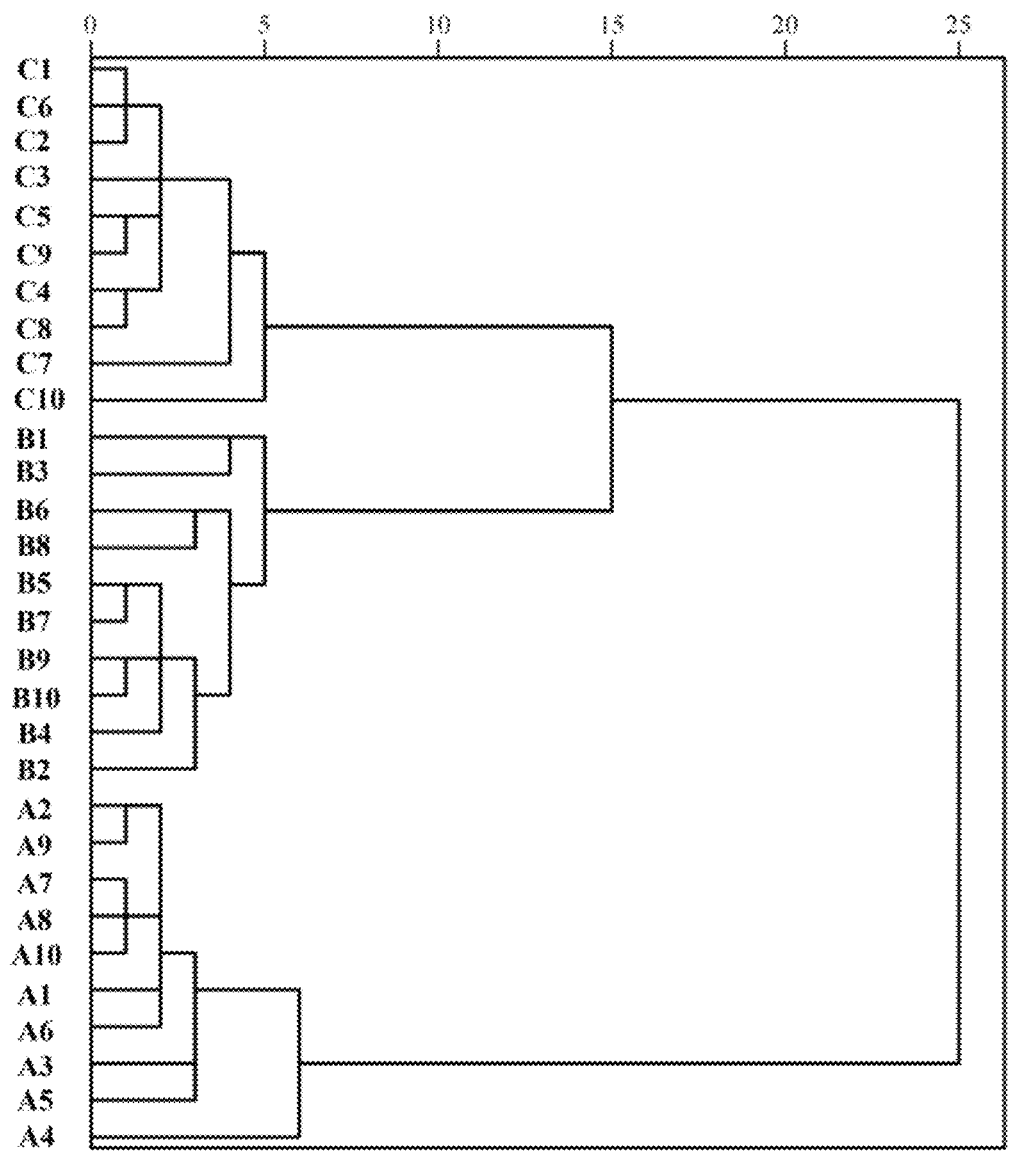
FIG. 8 is a HCA dendrogram of the SERS spectra of spores of the three food-borne pathogens. A1-A10, *C. perfringens* spores; B1-B10, *B. subtilis* spores, C1-C10, *B. cereus* spores.
Figure 9:
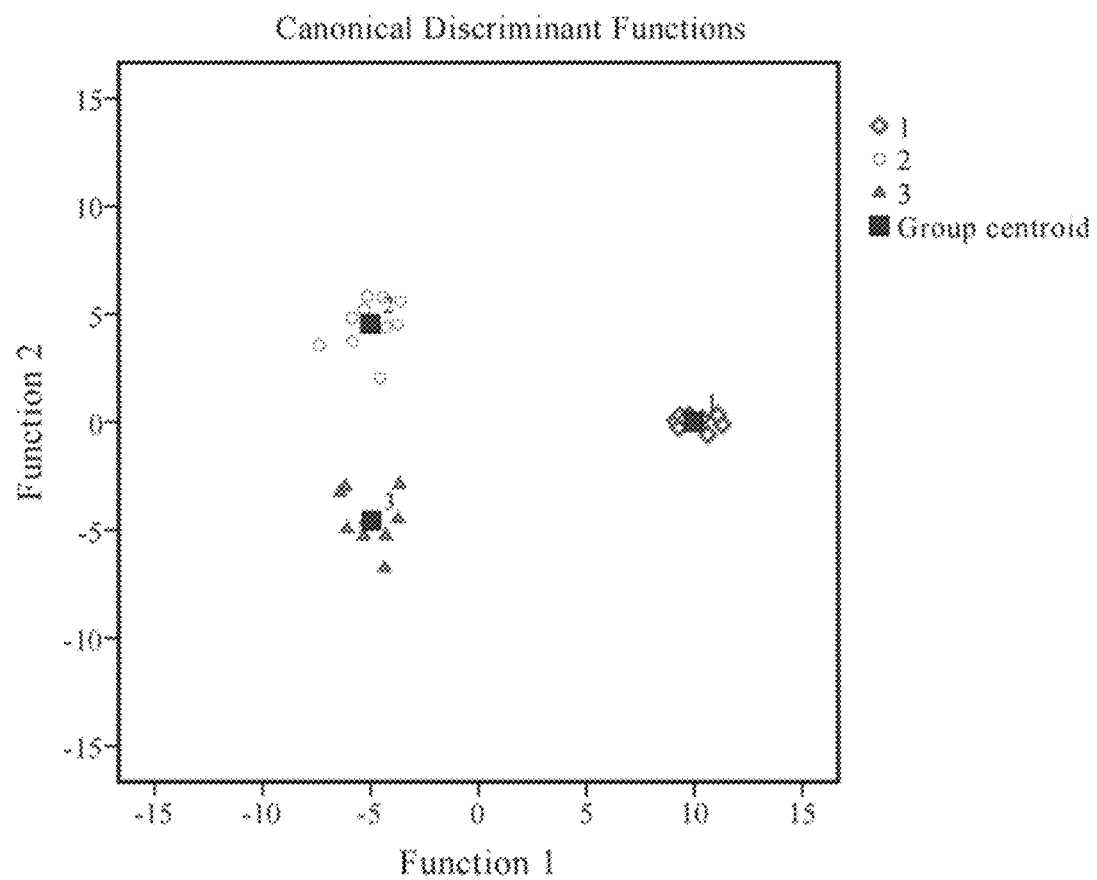
FIG. 9 is a scatter diagram of the SERS spectra of spores of the three food-borne pathogens analyzed by LDA.

In order to test the reproducibility of substrate material for SERS detection of three spores, the three spores were attached to the AgNPs@SASP solid phase substrate respectively, and after drying with nitrogen, a laser confocal Raman spectrometer was used to randomly scan 10 times with a scanning range of 400-3200 $cm^{-1}$. The reproducibility results of the substrate material for SERS detection of three spores are shown in FIG. 5. The 10 SERS spectra of each spore show good consistency. The results show that the SERS enhancement method based on the AgNPs@SASP prepared by self-assembly at a liquid-liquid interface as the substrate material has high stability and good reproducibility, which provides strong technical support for the rapid detection of food-borne pathogens based on SERS technology.

3. SERS Spectra Analysis of Three Spores Using AgNPs@SASP as the Substrate Material

*C. perfringens* spores, *B. subtilis* spores, and *B. cereus* spores were scanned randomly using SERS technology using AgNPs@SASP as the substrate material for 10 times, after baseline correction, normalization and smoothing, SERS average spectra of the spores of the three food-borne pathogens and a tentative peak attribution of SERS spectra are shown in FIG. 6 and Table 2. A right side of FIG. 6 shows the observation result of *C. perfringens* spores, *B. subtilis* spores and *B. cereus* spores under a phase contrast microscope with a 100× oil lens. It can be seen from FIG. 6 that the numbers of Raman vibration peaks of the three spores are significantly different (*C. perfringens* spores>*B. subtilis* spores>*B. cereus* spores). The concentration of $Ca^{2+}$-DPA in the spores is relatively high (estimated to be 5%-15% of a dry weight of the spores). In the SERS spectra of the spores of the three food-borne pathogen, it can be seen that the number of Raman vibration peaks and peak intensity of $Ca^{2+}$-DPA are dominant, and the Raman vibration peaks are located at about 670-677 cm$^{-1}$, 1016-1021 cm$^{-1}$ and 1571-1578 cm$^{-1}$, similar to previous studies. The difference in the Ca$^{2+}$-DPA concentration of different spores results in different peak numbers and intensities, which can also be used as a basis for judging different spores. The comparison results of the SERS peak intensities of Ca$^{2+}$-DPA of the three different spores are shown in FIG. 7, where the peak intensities of Ca$^{2+}$-DPA of the three spores in the 1571-1578 cm$^{-1}$ band are greater than the other two Ca$^{2+}$-DPA peaks in the same spores, and the peak intensities of *B. cereus* spores in the 670-677 cm$^{-1}$, 1016-1021 cm$^{-1}$ and 1571-1578 cm$^{-1}$ bands are greater than those of *B. subtilis* spores and *C. perfringens* spores. The SERS spectra of $Ca^{2+}$-DPA of the three spores show obvious difference in peak intensity, which is the main characteristic peak of $Ca^{2+}$-DPA and also the main characteristic peak to distinguish the three spores.

Different Raman vibration peaks are attributed to the different components and vibrational forms of chemical bonds of the spores. *C. perfringens* spores show unique Raman vibration peaks at 455 $cm^{-1}$ (Polysaccharides), 534 $cm^{-1}$ (Protein disulfide stretch), 1159 $cm^{-1}$ (C—C/C—N stretch of proteins), 1250 $cm^{-1}$ (C—$H_2$ stretching vibration) and 1450 $cm^{-1}$ ($CH_2CH_3$ deformation); *B. subtilis* spores show a unique Raman vibration peak at 793 $cm^{-1}$ (Cytosine or uracil of nucleic acids); *B. cereus* spores show a unique Raman vibration peak at 1416 $cm^{-1}$ ($CH_2$ sciss of lipids). Peaks located at 948-954 $cm^{-1}$ (Phospholipid N—C stretch) and 1299-1301 $cm^{-1}$ (—$CH_2$ deformation of Lipid) exist in both SERS spectra of *B. subtilis* spores and *B. cereus* spores, but not in the spectrum of *C. perfringens* spores. It can be seen that in the SERS spectra, the difference in the peak position and peak intensity of the Raman vibration peak can be observed in the spores of the three food-borne pathogens, indicating that the SERS technology using AgNPs@SASP as the substrate material has the ability to distinguish the spores of different food-borne pathogens.

TABLE 2

Tentative attributions of SERS spectral Raman shifts of spores of three food-borne pathogens

| *C. perfringens* Spores | *B. subtilis* Spores | *B. cereus* Spores | peak attribution | Raman shift ($cm^{-1}$) |
|---|---|---|---|---|
| 455 | | | Polysaccharides | 456 |
| 534 | | | Protein disulfide stretch | 540 |
| 670 | 675 | 677 | $Ca^{2+}$-DPA | 662 |
| | 793 | | Cytosine or uracil (nucleic acids) | 780-795 |
| | 954 | 948 | Phospholipid N—C stretch | 930-957 |
| 1016 | 1021 | 1018 | $Ca^{2+}$-DPA | 1017 |
| 1093 | | 1088 | O═P—O (nucleic acid) | 1092 |
| 1159 | | | C—C/C—N stretch (proteins) | 1158 |
| 1209 | | | C—$H_2$ stretching vibration | 1220 |
| 1250 | | | protein amide III | 1253 |
| | 1301 | 1299 | —CH2 deformation (Lipid) | 1297 |
| 1313 | | | Amide III | 1312 |
| 1347 | 1338 | 1343 | Adenine, amide III | 1338 |
| | | 1416 | $CH_2$ sciss (lipids) | 1415 |
| 1450 | | | $CH_2CH_3$ deformation | 1449 |
| | 1528 | 1547 | Amine II | 1550 |
| 1571 | 1578 | 1576 | $Ca^{2+}$-DPA | 1570-1580 |

4. Multivariate Statistical Analysis

In order to better realize the qualitative identification of spores of different food-borne pathogens, and avoid the interference of similar Raman vibration spectra on the classification and identification of microorganisms, combined with hierarchical cluster analysis (HCA) and linear discriminant analysis (LDA) in the multivariate statistical analysis method, the classification and comparative analysis of the SERS detection of spores of three food-borne pathogens using AgNPs@SASP as the substrate material were conducted from a statistical point of view. HCA can cluster the SERS spectra of the three spores and then judge and analyze them to construct a dendrogram to judge the similarities and differences between the research object populations. LDA is a simple linear recognition algorithm and a supervised learning dimensionality reduction technology, which can produce categorization output for each sample with a data set, and can be used to distinguish and evaluate the degree of discrimination of different bacterial populations. The results are shown in FIG. 8, FIG. 9, and Table 3.

It can be seen from the HCA analysis results (FIG. 8) that the 30 SERS spectra are divided into 3 clusters without cross-interference between each cluster. The three pathogens can be clearly divided into three clusters at a cluster distance of 7. *B. subtilis* spores and *B. cereus* spores are clustered into one cluster at a cluster distance of 15. The SERS characteristic Raman spectra of *B. subtilis* spores and *B. cereus* spores, which are clustered into one cluster at a cluster distance of 15, are similar, because *B. subtilis* spores and *B. cereus* spores all belong to the spores of the genus *Bacillus* with a relatively similar biochemical structure and composition, so they are distinct from the genus *Clostridium* of *C. perfringens* spores in terms of structure and composition, similar to the research of Peter et al. The HCA analysis not only effectively realize the distinction between the three spores, but also realize the distinction between *Clostridium* spores and *Bacillus* spores. It can be seen from FIG. 9 and Table 3 that the established LDA model has an accuracy rate of 100%, and can completely distinguish the SERS spectra of the spores of the three food-borne pathogens. The three food-borne pathogens are clustered into three independent clusters, and all samples of each food-borne pathogen are concentrated in a relatively small area near the centroid point without any overlapping area, with good sensitivity and specificity of 100%. The above results show that the multivariate statistical analysis method combining HCA and LDA can realize the rapid and accurate identification of spores of different food-borne pathogens.

TABLE 3

Using the LDA method to distinguish and assess the degree of discrimination of different bacterial populations

| sample | prediction group | | | | sensitivity (%) | specificity (%) |
| --- | --- | --- | --- | --- | --- | --- |
| | 1 | 2 | 3 | total | | |
| 1 | 10 | 0 | 0 | 10 | | |
| 2 | 0 | 10 | 0 | 10 | 100 | 100 |
| 3 | 0 | 0 | 10 | 10 | | |

The basic principles an main features of the present disclosure an the advantages of the present disclosure have been shown and described above. Those skilled in the prior art should understand that the present disclosure is not limited by the above embodiments. The above embodiments and descriptions only illustrate the principles of the present disclosure, without departing from the spirit and scope of the present disclosure, there will be various changes and improvements in the present disclosure, and these changes and improvements fall within the scope of the claimed disclosure. The scope of protection claimed by the present disclosure is defined by the appended claims and their equivalents.

What is claimed is:

1. A method for preparing a AgNPs@SASP substrate material, the method comprising:
   (1) preparing AgNPs by a seed mediated two-step growth method, comprising:
   a) adding ultrapure water to an aqueous trisodium citrate solution, heating, then adding a AgNO$_3$ solution and a NaBH$_4$ solution, stirring, thereafter cooling to room temperature, and adding ultrapure water to obtain a AgNPs starting seed solution; and
   b) adding the aqueous trisodium citrate solution to ultrapure water, then adding the AgNO$_3$ solution and the AgNPs starting seed solution at a constant speed, stirring a resulting mixed solution for 1 h, cooling to room temperature, then continuing the addition of the aqueous trisodium citrate solution and the AgNO$_3$ solution, heating and stirring for 1 h, adding ultrapure water, then cooling to room temperature, and storing at 4° C. away from light; and
   (2) preparing a solid-phase AgNPs@SASP substrate material by self-assembly of the AgNPs prepared in step (1), comprising:
   enriching the AgNPs prepared in step (1) by centrifugation, then suspending in absolute ethanol by ultrasonic dispersion, injecting to a water-cyclohexane oil-water interface with a pipette, where silver nanoparticles are drawn to the liquid-liquid interface by surface tension to form a thin film with a monomolecular arrangement floating on a liquid surface after volatilization of cyclohexane, inserting a glass slide or a silicon wafer deep below the liquid surface, making the silver nanoparticle film adhered to the silicon wafer by an inclined inserting and pulling method, and drying with nitrogen, thereby obtaining the AgNPs@SASP substrate material.

2. The method for preparing a AgNPs@SASP substrate material according to claim 1, wherein,
   in step a), a mass fraction of the aqueous trisodium citrate solution is 1%, a mass fraction of the AgNO$_3$ solution is 1%, a mass fraction of the NaBH$_4$ solution is 0.1%, and a volume ratio of the aqueous trisodium citrate solution, the ultrapure water, the AgNO$_3$ solution and the NaBH$_4$ solution is 20:75:1.7:2.

3. The method for preparing a AgNPs@SASP substrate material according to claim 1, wherein,
   a heating temperature in step a) is 70° C., a heating time is 15 min, and the stirring is conducted by stirring at 70° C. and then cooling to room temperature.

4. The method for preparing a AgNPs@SASP substrate material according to claim 1, wherein in step b), a volume ratio of the ultrapure water, the AgNPs starting seed solution, the AgNO$_3$ solution added for the first time, and the aqueous trisodium citrate solution added for the first time is 75:10:1.7:2, wherein a mass fraction of the AgNO$_3$ solution is 1%, and a mass fraction of the aqueous trisodium citrate solution is 1%.

5. The method for preparing a AgNPs@SASP substrate material according to claim 1, wherein in step b), an amount of the AgNO$_3$ solution and an amount of the aqueous trisodium citrate solution added for the second time are the same as those of the first time, and a heating temperature is 70° C.

* * * * *